United States Patent
Hoffman et al.

(10) Patent No.: US 8,607,731 B2
(45) Date of Patent: Dec. 17, 2013

(54) CATHODE WITH INNER AND OUTER ELECTRODES AT DIFFERENT HEIGHTS

(75) Inventors: Daniel J. Hoffman, Saratoga, CA (US); Douglas A. Buchberger, Jr., Livermore, CA (US); Semyon L. Kats, San Francisco, CA (US); Dan Katz, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 1298 days.

(21) Appl. No.: 12/144,463

(22) Filed: Jun. 23, 2008

(65) Prior Publication Data

US 2009/0314433 A1    Dec. 24, 2009

(51) Int. Cl.
*C23C 16/00* (2006.01)
*C23C 16/50* (2006.01)
*C23F 1/00* (2006.01)

(52) U.S. Cl.
USPC ............. 118/723 E; 118/723 R; 118/728; 156/345.48; 156/345.51

(58) Field of Classification Search
USPC .............. 118/723 E, 723 R, 728; 156/345.48, 156/345.51
See application file for complete search history.

(56) References Cited

U.S. PATENT DOCUMENTS

| | | | |
|---|---|---|---|
| 5,748,434 A | 5/1998 | Rossman et al. | |
| 6,023,405 A | 2/2000 | Shamouilian et al. | |
| 6,189,483 B1 | 2/2001 | Ishikawa et al. | |
| 6,267,839 B1 | 7/2001 | Shamouilian et al. | |
| 6,488,820 B1 | 12/2002 | Burkhart | |
| 6,490,144 B1 | 12/2002 | Narendrnath et al. | |
| 6,490,146 B2 | 12/2002 | Wang et al. | |
| 6,494,958 B1 | 12/2002 | Shamouilian et al. | |
| 6,557,248 B1 | 5/2003 | Shamouilian et al. | |
| 6,581,275 B2 | 6/2003 | Narendrnath et al. | |
| 6,944,006 B2 | 9/2005 | Zheng et al. | |
| 2004/0040664 A1* | 3/2004 | Yang et al. | 156/345.51 |
| 2004/0040665 A1* | 3/2004 | Mizuno et al. | 156/345.51 |
| 2007/0047170 A1 | 3/2007 | Sun et al. | |
| 2007/0283884 A1 | 12/2007 | Tiller et al. | |

FOREIGN PATENT DOCUMENTS

| | | |
|---|---|---|
| JP | 09176860 A | 7/1997 |
| JP | 2003133398 A | 5/2003 |
| JP | 2003158117 A | 5/2003 |
| TW | 200406839 A | 5/2004 |
| WO | WO 02/073654 A1 * | 9/2002 |

(Continued)

OTHER PUBLICATIONS

PCT International Search Report and Written Opinion dated Jan. 12, 2010 for International Application No. PCT/US2009/046994.

(Continued)

*Primary Examiner* — Laura Edwards
*Assistant Examiner* — Binu Thomas
(74) *Attorney, Agent, or Firm* — Patterson & Sheridan, LLP

(57) ABSTRACT

An apparatus for generating uniform plasma across and beyond the peripheral edge of a substrate has a dielectric body with an upper electrode and an annular electrode embedded therein. The outer perimeter of the upper electrode overlaps the inner perimeter of the annular electrode. In one embodiment, the upper electrode and the annular electrode are electrically coupled by molybdenum vias. In one embodiment, the upper electrode is coupled to a DC power source to provide electrostatic force for chucking the substrate. In one embodiment, the upper electrode is coupled to an RF source for exciting one or more processing gasses into plasma for substrate processing.

16 Claims, 3 Drawing Sheets

(56) References Cited

FOREIGN PATENT DOCUMENTS

| WO | WO02073654 | * | 9/2002 |
| WO | WO-02073654 A1 | | 9/2002 |

OTHER PUBLICATIONS

Official Letter dated Jan. 29, 2013 from the Chinese Patent Office for corresponding Chinese Patent Application No. 200980123938.X.

* cited by examiner

CATHODE WITH INNER AND OUTER ELECTRODES AT DIFFERENT HEIGHTS

BACKGROUND

1. Field

Embodiments of the present invention generally relate to an apparatus capable of generating uniform plasma across and beyond the peripheral edge of a substrate.

2. Description of the Related Art

In substrate processing applications, a substrate is placed on a substrate support in a process chamber and exposed to an energized gas to deposit or etch material on the substrate. The support may comprise an electrostatic chuck with at least one electrode that may be electrically charged to electrostatically hold the substrate on the support. The electrode may also be electrically biased, for example with high frequency electrical power, such as radio frequency (RF) power, to energize process gas provided in the chamber to process the substrate.

In a typical process chamber, a gas distribution device introduces process gas into the chamber. The gas is energized into plasma by applying an RF voltage to an electrode, such as a cathode, within a substrate support, such as an electrostatic chuck, and by electrically grounding an anode to form a capacitive field in the process chamber. A substrate may be electrically biased with respect to the cathode, such as by applying a direct current to the cathode, and an electrostatic force generated to attract and hold the substrate on the electrostatic chuck. The substrate is processed by the plasma generated within the process chamber.

During processing, the substrate support surface, such as the surface of the electrostatic chuck, is subjected to plasma and ion bombardment within the processing chamber. Over time, the plasma and ion bombardment may damage portions of the electrostatic chuck. To protect the chuck and increase its lifetime, a process kit is positioned around the electrostatic chuck within the processing chamber. The process kit typically includes an annular ring that covers the upper portion of the electrostatic chuck that is exposed to the plasma.

FIG. 1 is a cross-sectional view of a prior art electrostatic chuck 100 with an annular ring 108 installed. The electrostatic chuck 100 includes an annular flange 102, which supports the annular ring 108. The annular ring 108 is typically comprised of an insulating or dielectric material, such as a ceramic material. The primary purpose of the annular ring is to prevent the plasma in the processing chamber from contacting and eroding the electrostatic chuck 100.

The electrostatic chuck 100 includes a chucking surface 106 for supporting and retaining a substrate 130 to be processed. A cathode 120 is positioned within the electrostatic chuck 100 near the chucking surface 106. A central conductor 195 supplies DC voltage to the cathode 120 for retaining the substrate 130. The central conductor 195 also supplies RF voltage to the cathode 120 for capacitively energizing a process gas into plasma for processing the substrate 130.

As can be seen in the configuration depicted in FIG. 1, the cathode 120 is located near the chucking surface 106 for generating adequate electrostatic force required to retain the substrate 130. As such, the cathode 120 is located within the portion of the chuck 100 that is circumscribed by the annular ring 108. Therefore, the peripheral portion of the cathode 120 is radially terminated near or within the periphery of the substrate 130. It has been discovered that this configuration leads to non-uniformity in the RF field generated by the cathode 120 resulting in undesirable non-uniformities in the peripheral edge of the substrate 130.

Accordingly, a need exists for an electrostatic chuck capable of providing uniform plasma across the substrate surface, and in particular, across the peripheral edge of the substrate. A further need exists for an electrostatic chuck capable of providing uniform plasma beyond the peripheral edge of the substrate.

SUMMARY

Embodiments of the present invention generally relate to an apparatus capable of generating uniform plasma across and beyond the peripheral edge of a substrate.

In one embodiment, a substrate support comprises a dielectric body with an upper surface capable of supporting a substrate and an annular flange below the upper surface. An electrode is positioned within the dielectric body between the upper surface and the annular flange. An annular electrode is positioned at least partially within the annular flange, and a vertical conductor electrically couples the electrode to the annular electrode.

In one embodiment, an electrostatic chuck comprises a dielectric support member with an upper region circumscribed by an annular recess. An electrode is embedded within the upper region. An annular electrode is embedded within the dielectric support member and positioned below the annular recess. In one embodiment, a region along the outer perimeter of the electrode overlaps a region along the inner perimeter of the annular electrode. A plurality of vertical conductors electrically couples the electrode and the annular electrode.

In another embodiment, a substrate processing apparatus comprises a chamber having a wall, a ceiling and a support member defining a processing region. In one embodiment, the support member comprises a dielectric body with an upper surface capable of supporting a substrate and an annular flange region positioned below the upper surface. In one embodiment, the support member further comprises an electrode positioned within the dielectric body above the annular flange region, and an annular electrode positioned at least partially within the annular flange region. In one embodiment, a vertical conductor electrically couples the electrode to the annular electrode. In one embodiment, the substrate processing apparatus further comprises an RF power source electrically coupled to the electrode, and a DC power source electrically coupled to the electrode.

BRIEF DESCRIPTION OF THE DRAWINGS

So that the manner in which the above recited features of the embodiments of the present invention can be understood in detail, a more particular description, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention relate to an apparatus used to support and retain a substrate, while, for example, etching the substrate with plasma, implanting material in the substrate by ion implantation, depositing material on the substrate by chemical or physical vapor deposition, or performing other processes.

Figure 1:
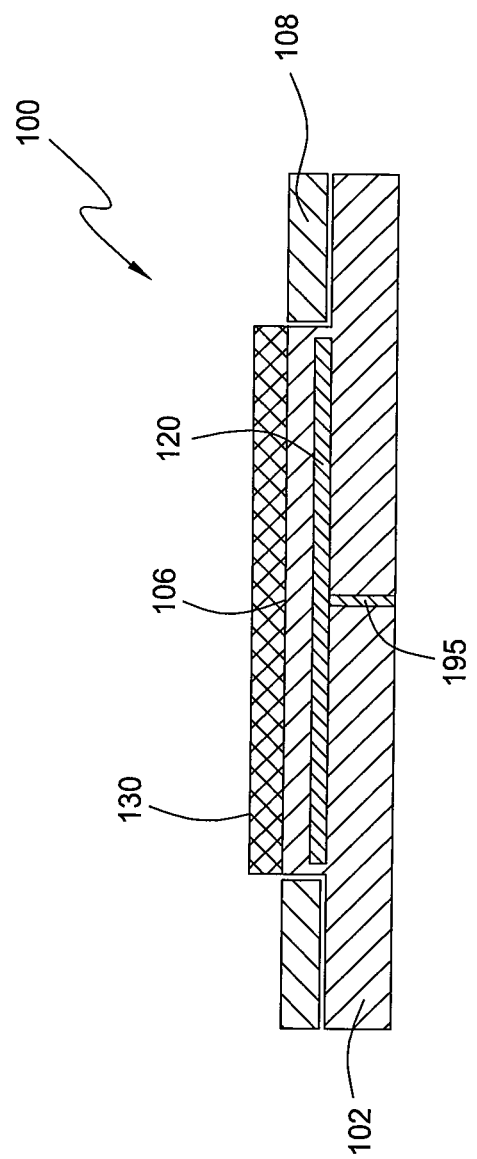
FIG. 1 is a schematic, cross-sectional view of a prior art electrostatic chuck with an annular ring of a process kit disposed thereon.
Figure 2:
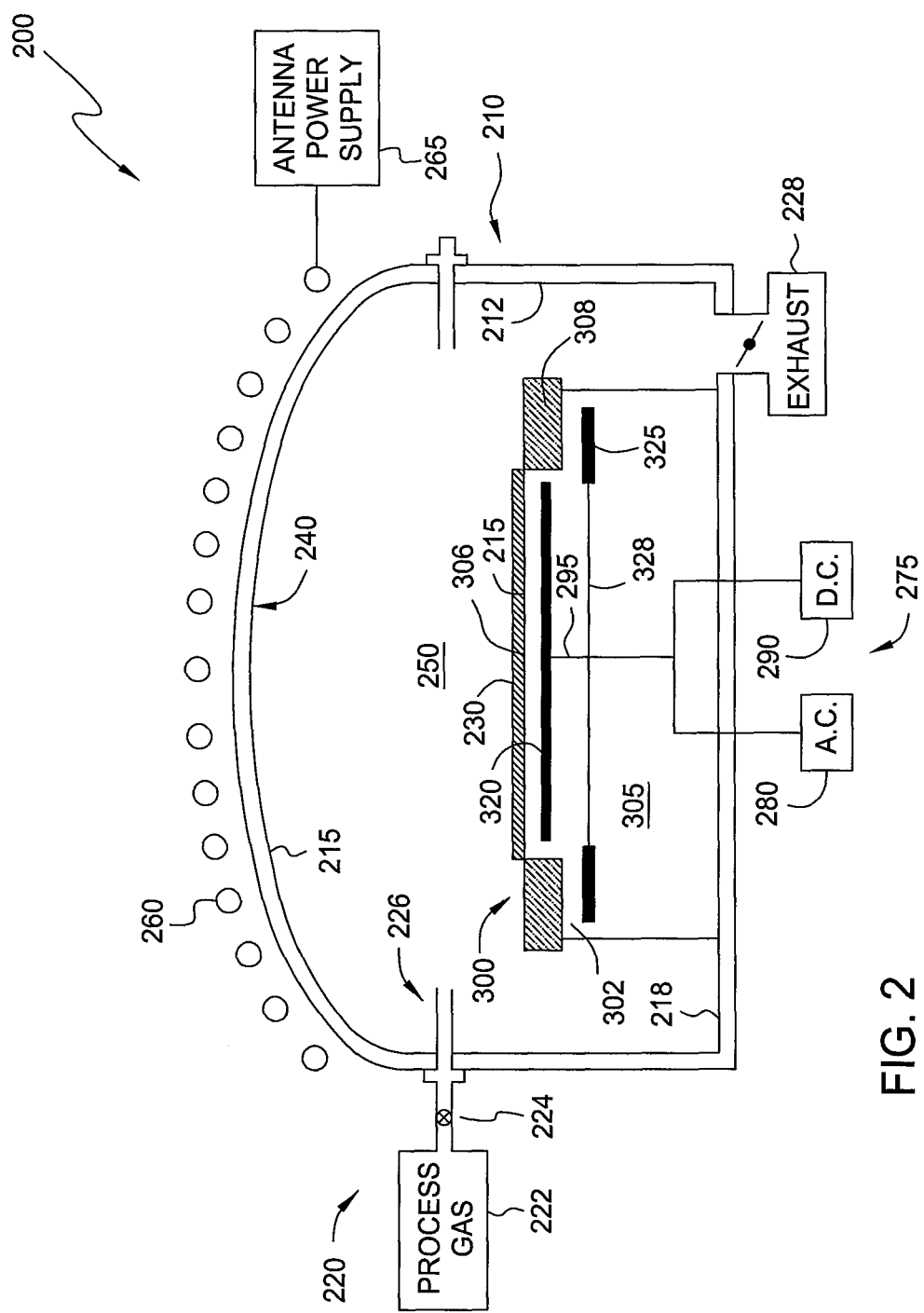
FIG. 2 is a schematic, cross-sectional view of an exemplary processing apparatus, in which embodiments of the present invention may be used.

FIG. 2 is a schematic, cross-sectional view of an exemplary processing apparatus 200, suitable for processing a substrate 230. The apparatus 200 generally comprises an enclosed process chamber 210 having sidewalls 212, a ceiling 215, and a bottom wall 218. Process gas is introduced into the chamber 210 through a gas distribution system 220, which may include a process gas supply 222, a gas flow control system 224, and a gas distributor 226. Process gas may be introduced adjacent the periphery of the substrate 230, as shown. Alternatively, process gas may be introduced above the substrate 230 through a perforated showerhead gas diffuser (not shown) or through upwardly extending gas distributors (not shown).

An exhaust system 228 may comprise one or more exhaust pumps and throttle valves. The exhaust system is used to exhaust spent process gas byproducts and to control pressure in the process chamber 210. A computer control system may operate the gas distribution system 220 and the exhaust system 228 using programmed process conditions. The particular embodiment of processing apparatus 200 is illustrative only and should not be construed as limiting the scope of the claimed invention.

After process gas is introduced into the chamber 210, the gas is energized to form plasma 250. An antenna 260, such as one or more inductor coils, may be provided adjacent the chamber 210. An antenna power supply 265 may power the antenna 260 to inductively couple energy, such as RF energy, to the process gas to form plasma 250 in a process zone in the chamber 210. Alternatively, or in addition, process electrodes comprising a cathode below the substrate 230 and an anode above the substrate 230 may be used to couple RF power to generate plasma 250 as subsequently described herein. A power source 275 comprising an AC source 280 and a DC source 290 may be used to supply power to the process electrodes. The AC source 280 may comprise a generator and a bias RF match circuit. The operation of the power source 275 may be controlled by a controller that also controls the operation of other components in the chamber 210.

In one embodiment, an electrostatic chuck 300 for holding the substrate 230 is positioned within the chamber 210. The electrostatic chuck 300 comprises an electrode 320 embedded within a dielectric body 305. The electrostatic chuck 300 may be used to produce electrostatic chucking force to electrostatically attract and hold the substrate 230 to the electrostatic chuck 300 by supplying a DC chucking voltage to the electrode 320 from the DC source 290 and a central conductor 295. The DC power supply 290 may provide a DC chucking voltage of about 200 to about 2000 volts to the electrode 320. The DC power supply 290 may also include a system controller for controlling the operation of the electrode 320 by directing a DC current to the electrode 320 for chucking and de-chucking the substrate 230.

In one embodiment, the electrode 320 serves as a plasma generating cathode. An anode 240 comprising a conductor element is positioned in the chamber 210 directly over the substrate 230 or at another position in or adjacent the chamber 210. The anode 240 may be sufficiently large to encompass substantially the entire area of the substrate 230. By applying an RF voltage to the electrode 320, the electrode 320 and the anode 240 capacitively couple to form an RF electric field in the chamber 210. Plasma 250 is thereby energized and sustained.

The plasma generating RF voltage may be applied to the electrode 320 by the AC power source 280. The AC power source 280 provides an RF voltage to the electrode 320 through the central conductor 295. The voltage may have one or more frequencies from about 400 kHz to about 300 MHz.

In one embodiment, the anode 240 may be the ceiling 215 of the chamber 210. The ceiling 215 may serve as a conductor, which may be biased or grounded. The anode 240 may also be a semiconductor that provides low impedance to an RF induction field transmitted by the induction antenna 260. The ceiling 215 may be sufficiently electrically conductive to serve as the anode 240 and may also be permeable to an RF induction field generated by the inductor antenna 260 above the ceiling 215.

In one embodiment, the electrostatic chuck 300 comprises an annular flange 302 located beyond the peripheral edge of and below a chucking surface 306 of the electrostatic chuck 300. An annular ring 308 may be positioned onto the annular flange 302 to protect the annular flange 302 from the plasma 250 generated in the process apparatus 200.

In one embodiment, the electrostatic chuck 300 may include an annular electrode 325 embedded within the dielectric body 305 below the electrode 320. The annular electrode 325 may be an annular ring electrically coupled to the electrode 320 via one or more radial conductors 328 and the central conductor 295. The annular electrode 325 may function to radially extend the plasma 250 well beyond the peripheral edge of the substrate 230 by generating an RF field radially outward from that generated by the electrode 320.

In one embodiment, the one or more radial conductors 328 are comprised of an electrically conducting material, such as aluminum or copper.

In one embodiment, the presence of the one or more radial conductors 328 may create azimuthal non-uniformities in the RF field generated by the electrode 320 and the annular electrode 325, which may generate non-uniform plasma 250 and result in non-uniform processing of the substrate 230.

Figure 3:
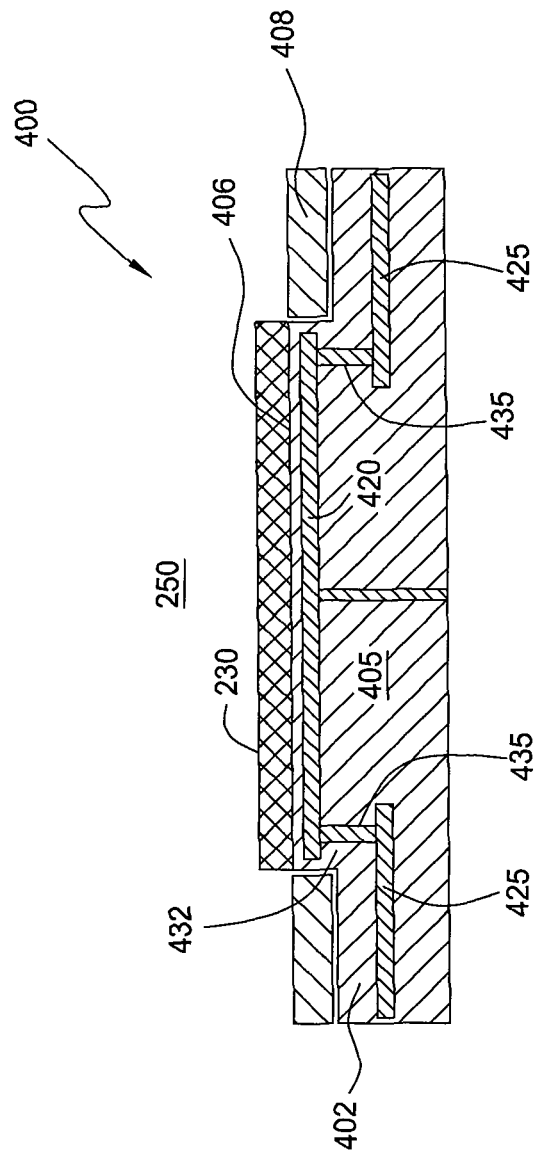
FIG. 3 is a cross-sectional view of an embodiment of an electrostatic chuck according to the present invention.

FIG. 3 is a schematic, cross-sectional view of an electrostatic chuck 400 according to one embodiment of the present invention. Similarly to the embodiment in FIG. 2, the electrostatic chuck 400 comprises an annular flange 402 located beyond the peripheral edge of and below a chucking surface 406 of the electrostatic chuck 400. An annular ring 408 may be positioned onto the annular flange 402 to protect the annular flange 402 from the plasma 250 generated in the process apparatus 200.

In one embodiment, the annular ring 408 may comprise one or more of aluminum oxide, aluminum nitride, boron carbide, boron nitride, diamond, quartz, silicon oxide, silicon nitride, titanium oxide titanium carbide, zirconium boride, zirconium carbide, and equivalents or mixtures thereof.

In one embodiment, the electrostatic chuck 400 further comprises an electrode 420 embedded within a dielectric body 405 of the electrostatic chuck 400. The electrostatic chuck 400 may further include an annular electrode 425 embedded within the dielectric body 405 below the electrode 420 and extending radially beyond the peripheral edge of electrode 420.

The dielectric body 405 may be a monolithic structure of thermally fused ceramic or polymer. Monolith ceramics typically have low porosity and good electrical properties. The high dielectric breakdown strength of the monolithic ceramic structure may also allow application of high RF power to the electrode 420 and the annular electrode 425. In one embodiment, the dielectric body 405 may be fabricated from a ceramic having porosity of less than about 20%. In one embodiment, the dielectric body 405 may be fabricated from a ceramic having porosity of less than about 10%. In one embodiment, the dielectric body 405 may comprise one or more of aluminum oxide, aluminum nitride, boron carbide, boron nitride, silicon oxide, silicon carbide, silicon nitride, titanium oxide, titanium carbide, yttrium oxide, beryllium oxide, and zirconium oxide.

In one embodiment, the dielectric body 405 may comprise laminate of polyimide or aramid layers stacked around the electrode 420 and the annular electrode 425. The dielectric body 405 may be fabricated by an autoclave pressure forming process.

In one embodiment, the outer, peripheral edge of the electrode 420 overlaps the inner, peripheral edge of the annular electrode 425, which defines an overlapping region 432 with the dielectric body 405 of the electrostatic chuck 400. The electrode 420 and the annular electrode 425 may be electrically coupled by a plurality of vertical conducting members 435 positioned within the overlapping region 432. In one embodiment, the vertical conducting members 435 are vias. In one embodiment, the vertical conducting members 435 are positioned in the overlapping region 432 such that the vertical conducting members are equally spaced about the inner, peripheral edge of the annular electrode 425. In one embodiment, the vertical conducting members 435 are evenly spaced about the peripheral edge of the annular electrode 425 and sufficient in number such that the distance between adjacent vertical conducting members 435 is a selected fraction of the wavelength of a selected RF frequency.

In one embodiment, the electrode 420 and the annular electrode 425 may be fabricated from a conductive metal such as aluminum, copper, silver, gold, molybdenum, tantalum, or mixtures thereof. The electrode 420 and the annular electrode 425 may comprise a mesh of wire having a diameter of about 100 microns to about 1000 microns, a mesh size of about 5 to 200 mesh, and a circular, elliptical, rectangular cross-section. In one embodiment, the electrode 420 and annular electrode 425 may comprise a mesh made of electrically conductive wires, each wire having a longitudinal central axis that is oriented substantially parallel to the plane of the respective mesh electrode. The mesh comprises less metal than an equivalently sized solid electrode, and consequently, is subject to less thermal expansion.

In one embodiment, the electrode 420 and the annular electrode 425 comprise molybdenum mesh. In one embodiment, the vertical conducting members 435 are molybdenum vias.

In one embodiment, as depicted in FIG. 4, the annular electrode 425 may function to radially extend the plasma 250 well beyond the peripheral edge of the substrate 230 by generating an RF field radially outward from that generated by the electrode 420. Additionally, the use of the vertical conducting members 435 eliminates the need for the radial conducting members 328 shown in FIG. 3. Thus, a uniform RF field is generated by the electrode 420 and the annular electrode 425, resulting in uniform plasma 250 generation and uniform processing of the substrate 230, including across the peripheral edge of the substrate 230.

While the foregoing is directed to embodiments of the present invention, other and further embodiments of the invention may be devised without departing from the basic scope thereof, and the scope thereof is determined by the claims that follow.

The invention claimed is:

1. A substrate support, comprising:
   a dielectric body with an upper surface capable of supporting a substrate and an annular flange below the upper surface;
   an electrode positioned within the dielectric body between the upper surface and the annular flange, wherein the electrode is configured to receive a radio frequency (RF) energy from a RF power source coupled to the electrode;
   an annular electrode at least partially within the annular flange; and
   a vertical conductor connecting the annular electrode to the RF power source through the electrode, wherein the vertical conductor comprises a plurality of conductive vias uniformly spaced such that a distance between adjacent conductive vias is a selected fraction of a wavelength of an RF frequency emitted by the RF power source, and each conductive via has a first end electrically coupled to the electrode and a second end electrically coupled to the annular electrode.

2. The substrate support of claim 1, wherein an outer perimeter of the electrode at least partially overlaps an inner perimeter of the annular electrode.

3. The substrate support of claim 1, wherein the plurality of conductive vias comprise molybdenum.

4. The substrate support of claim 1, wherein the plurality of conductive vias are uniformly spaced about an inner peripheral region of the annular electrode.

5. The substrate support of claim 1, wherein the annular electrode comprises a material selected from the group consisting of aluminum, copper, silver, gold, molybdenum, and tantalum.

6. The substrate support of claim 5, wherein the annular electrode comprises a molybdenum mesh.

7. The substrate support of claim 1, wherein the electrode is further configured for coupling to a DC power source.

8. The substrate support of claim 1, wherein the electrode and the annular electrode comprise molybdenum mesh and the vertical conductive member is a plurality of molybdenum vias.

9. An electrostatic chuck, comprising:
   a dielectric support member with an upper region circumscribed by an annular recess;
   an electrode embedded within the upper region, wherein the electrode is configured to receive a radio frequency (RF) energy from a RF power source coupled to the electrode;
   an annular electrode embedded within the dielectric support member and positioned below the annular recess, wherein a region along the outer perimeter of the electrode overlaps a region along the inner perimeter of the annular electrode; and
   a plurality of vertical conductors electrically coupling the electrode and the annular electrode, wherein the plurality of vertical conductors connect the annular electrode to the RF power source through the electrode, the plurality of vertical conductors are uniformly spaced and a distance between adjacent vertical conductors is a selected fraction of a wavelength of an RF frequency emitted by the RF power source, and each vertical conductor has a first end electrically coupled to the electrode and a second end electrically coupled to the annular electrode.

10. The electrostatic chuck of claim 9, wherein the plurality of vertical conductors are molybdenum vias.

11. The electrostatic chuck of claim 9, further comprising:
    a DC power source coupled to the electrode.

12. The electrostatic chuck of claim 9, wherein the dielectric support member comprises a material selected from the group consisting of aluminum oxide, aluminum nitride, boron carbide, boron nitride, silicon oxide, silicon carbide, silicon nitride, titanium oxide, titanium carbide, yttrium oxide, beryllium oxide, and zirconium oxide.

13. The electrostatic chuck of claim 9, wherein the electrode is comprised of a material selected from the group consisting of aluminum, copper, silver, gold, molybdenum, and tantalum.

14. The electrostatic chuck of claim 9, wherein the electrode and the annular electrode comprise molybdenum mesh and the plurality of vertical conductors are molybdenum vias.

15. A substrate processing apparatus, comprising:
a chamber having a wall, a ceiling and a support member defining a processing region, wherein the support member comprises:
  a dielectric body with an upper surface capable of supporting a substrate and an annular flange region positioned below the upper surface;
  an electrode positioned within the dielectric body above the annular flange region;
  an annular electrode positioned at least partially within the annular flange region; and
  a vertical conductor having a first end electrically coupled to the electrode and a second end electrically coupled to the annular electrode;
an RF power source electrically coupled to the electrode; and
a DC power source electrically coupled to the electrode, wherein the vertical conductor comprises a plurality of molybdenum vias the plurality of molybdenum vias are evenly spaced such that a distance between adjacent vertical conductors is a selected fraction of a wavelength of an RF frequency emitted by the RF power source.

16. The substrate processing apparatus of claim 15, wherein the electrode and the annular electrode comprise molybdenum mesh and each of the plurality of molybdenum vias has a first end coupled to the electrode and a second end coupled to the annular electrode.

* * * * *